(12) United States Patent
Kim et al.

(10) Patent No.: US 7,161,296 B2
(45) Date of Patent: Jan. 9, 2007

(54) PLASMA DISPLAY DEVICE THAT EFFICIENTLY AND EFFECTIVELY DRAWS HEAT OUT FROM A FUNCTIONING PLASMA DISPLAY PANEL

(75) Inventors: Ki-Jung Kim, Cheonan (KR); Tae-Kyoung Kang, Asan (KR)

(73) Assignee: Samsung SDI Co., Ltd., Suwon-si (KR)

( * ) Notice: Subject to any disclaimer, the term of this patent is extended or adjusted under 35 U.S.C. 154(b) by 294 days.

(21) Appl. No.: 10/815,698

(22) Filed: Apr. 2, 2004

(65) Prior Publication Data

US 2004/0212554 A1    Oct. 28, 2004

(30) Foreign Application Priority Data

Apr. 28, 2003   (KR)   ............... 10-2003-0026847

(51) Int. Cl.
  *H01J 17/00*  (2006.01)
  *H05K 7/00*  (2006.01)
  *H05K 5/00*  (2006.01)

(52) U.S. Cl. .................... 313/581; 313/582; 361/681

(58) Field of Classification Search ........ 313/581–587; 361/679, 681, 724, 728, 736, 748, 752
See application file for complete search history.

(56) References Cited

U.S. PATENT DOCUMENTS

| | | | |
|---|---|---|---|
| 5,541,618 | A | 7/1996 | Shinoda |
| 5,661,500 | A | 8/1997 | Shinoda et al. |
| 5,663,741 | A | 9/1997 | Kanazawa |
| 5,674,553 | A | 10/1997 | Shinoda et al. |
| 5,724,054 | A | 3/1998 | Shinoda |
| 5,786,794 | A | 7/1998 | Kishi et al. |
| 5,952,782 | A | 9/1999 | Nanto |
| 5,990,618 | A | 11/1999 | Morita et al. |
| RE37,444 | E | 11/2001 | Kanazawa |
| 6,410,841 | B1 * | 6/2002 | Oh et al. .................. 136/242 |

(Continued)

FOREIGN PATENT DOCUMENTS

JP    02-148645    6/1990

(Continued)

OTHER PUBLICATIONS

"*Final Draft International Standard*", Project No. 47C/61988-1/Ed. 1; Plasma Display Panels—Part 1: Terminology and letter symbols, published by International Electrotechnical Commission, IEC. in 2003, and Appendix A—Description of Technology, Annex B—Relationship Between Voltage Terms And Discharge Characteristics; Annex C—Gaps and Annex D—Manufacturing.

*Primary Examiner*—Joseph Willams
*Assistant Examiner*—Bumsuk Won
(74) *Attorney, Agent, or Firm*—Robert E. Bushnell, Esq.

(57) ABSTRACT

A plasma display device includes a plasma display panel (PDP). A chassis base supports the PDP from a surface of the same opposite a surface that displays images, and a plurality of driving circuit boards are mounted on the chassis base. A front cabinet is positioned adjacent to the surface of the plasma display panel that displays images. Also, a back cover is positioned adjacent to a surface of the chassis base opposite the surface adjacent to the PDP and is integrally assembled to the front cabinet with the chassis base and the plasma display panel interposed therebetween. The plasma display device also includes thermoelectric semiconductor devices that are mounted within the back cover. The thermoelectric semiconductor devices act to discharge heat generated by the PDP and the driving circuit boards to outside the back cover.

24 Claims, 15 Drawing Sheets

U.S. PATENT DOCUMENTS

| | | |
|---|---|---|
| 6,630,916 B1 | 10/2003 | Shinoda |
| 6,707,436 B1 | 3/2004 | Setoguchi et al. |
| 2002/0043916 A1 | 4/2002 | Juen |

FOREIGN PATENT DOCUMENTS

| | | |
|---|---|---|
| JP | 2845183 | 10/1998 |
| JP | 2917279 | 4/1999 |
| JP | 2001-043804 | 2/2001 |
| JP | 2001-325888 | 11/2001 |
| KR | 10-2001-0039120 | 5/2001 |
| KR | 10-2002-0027801 | 4/2002 |

* cited by examiner

PLASMA DISPLAY DEVICE THAT EFFICIENTLY AND EFFECTIVELY DRAWS HEAT OUT FROM A FUNCTIONING PLASMA DISPLAY PANEL

CLAIM OF PRIORITY

This application claims priority to and the benefit of Korean Patent Application No. 2003-0026847 filed on Apr. 28, 2003 in the Korean Intellectual Property Office, the entire content of which is incorporated herein by reference.

BACKGROUND OF THE INVENTION

1. Field of the Invention

The present invention relates to a plasma display device, and more particularly, to a plasma display panel (PDP) of a plasma display device in which the panel includes a back cover providing a heat discharge function to reduce an internal temperature of the display device.

2. Description of the Related Art

Plasma display devices employing PDPs are emerging as one of the most popular flat panel display configurations used for wall-mounted televisions and other similar large-screen display applications. Predetermined images are displayed on the PDP using a discharge mechanism of discharge cells.

A plasma display device is structured by interposing a PDP and a chassis base between a front cabinet and a back cover, with the front cabinet and back cover being integrally formed to define an exterior of the plasma display device. The PDP is positioned adjacent to the front cabinet while the chassis base is positioned adjacent to the back cover. Also, a plurality of driving circuit boards are mounted to the chassis base.

Much research is being performed to improve all aspects of the plasma display device, that is, to achieve better brightness and contrast, minimize noise, realize a slimmer profile, and reduce weight. As a way to obtain a slimmer profile, the spaces between the PDP, chassis base, and back cover are reduced to realize an overall plasma display device depth of roughly 60 mm.

However, such a reduction in the spaces between the elements of the plasma display device causes the PDP and driving circuit boards to retain more of the heat that they generate. If this heat is unable to be sufficiently expelled from the plasma display device, the circuitry may malfunction. This is because circuit elements used to drive the PDP experience a drop in performance and reliability at temperatures at or above 65° C. It is therefore necessary to maintain temperatures within the device at suitable, relatively low levels.

The most common way heat is discharged from the plasma display device is to form a plurality of vent openings in the back cover through which the heat in the plasma display device escapes. However, since in addition to the heat in the device, EMI (electromagnetic interference), audio noise and electromagnetic noise generated by the driving circuit boards exit the display device through the vent openings, it is preferable that no more than a specific, limited number of vent openings be formed in the back cover. A consequence of this limitation is that the effectiveness of the vent openings and thus the ability to dissipate heat is also restricted.

Heat discharge mechanisms are disclosed in U.S. Pat. No. 5,990,618 to Morita et al. and in U.S. patent application Publication No. 2002/0043916 A1 to Juen. The heat discharge mechanisms disclosed in these publications are related to ways of expelling the heat generated by the PDPs in plasma display devices. However, because of the mounting of the heat discharge mechanisms of these patents between the rear of the PDP and the back cover, the internal structure of the plasma display device becomes complicated and efforts at making the device slimmer are hindered.

In addition, because the heat discharge mechanisms of the above publications use only heat conduction or convection current properties to perform their operation, there are limits to their ability to discharge heat. Also, the heat expelled by the heat discharge mechanisms in these publications is not directed to outside the back cover but instead remains within the display device. The ability to reduce internal temperatures of the display device of the two publications is therefore severely limited as a result.

SUMMARY OF THE INVENTION

It is therefore an object of the present invention to provide for an improved design for a plasma display device.

It is also an object of the present invention to provide a design for a plasma display device that efficiently draws heat away from the plasma display panel while not adding to the bulk or the thickness of the plasma display device.

It is further an object of the present invention to provide a design for a plasma display device that draws heat away from an inside of the device to an outside of the device without adding to the size or bulk of the display.

It is still an object of the present invention to provide a design for a plasma display device that is both compact and that dissipates heat rapidly enough to keep the temperature in the functioning display below 65° C.

It is yet another object of the present invention to provide a design for a plasma display device that is not only effective and compact, but also does not contain audio noise generating elements such as fans.

It is further an object of the present invention to provide a design for a plasma display device that is not only effective in dissipating heat and is compact in design but also effectively prevents electromagnetic noise, audio noise and electromagnetic interference from escaping from a functioning plasma display panel.

It is also an object of the present invention to provide a design for a plasma display device that efficiently removes heat from a functioning plasma display device where the design does not require maintenance throughout the life of the display.

It is still yet another object of the present invention to provide a method for controlling the internal temperature of a functioning plasma display device.

It is also an object of the present invention to provide a method for expelling heat to an outside of a functioning plasma display device having a novel design.

These and other objects can be achieved by a plasma display device that includes a plasma display panel (PDP) and driving circuit boards in which the display device actively expels heat generated therein to thereby maintain a low internal temperature. The novel plasma display device includes a PDP. A chassis base supports the PDP on a back side of the PDP. A plurality of driving circuit boards are mounted on the chassis base. A front cabinet is positioned adjacent to a front surface of the plasma display panel that displays images. Also, a back cover is positioned adjacent to a back surface of the chassis base opposite the surface of the chassis base that is adjacent to the plasma display panel. The back cover is integrally assembled to the front cabinet with the chassis base and the plasma display panel interposed therebetween. The plasma display device also includes thermoelectric semiconductor devices that are mounted on or in the back cover. Each of the thermoelectric semiconductor devices includes a heat absorbing surface that is positioned on a side of the back cover adjacent to the chassis base. Each thermoelectric semiconductor device also includes a heat emitting surface directed toward an exterior of the back cover. The thermoelectric semiconductor devices act to discharge heat generated by the functioning plasma display panel and the driving circuit boards to outside of the back cover.

Other aspects of the present invention include a power supply board to deliver power to a thermoelectric semiconductor driver that drives the thermoelectric semiconductor devices, a temperature sensor and a controller to turn on and off the power delivered to the thermoelectric semiconductor devices, the inclusion of a thin metal plate, a heat sink and/or an insulating cover attached to the above heat discharge assemblies.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
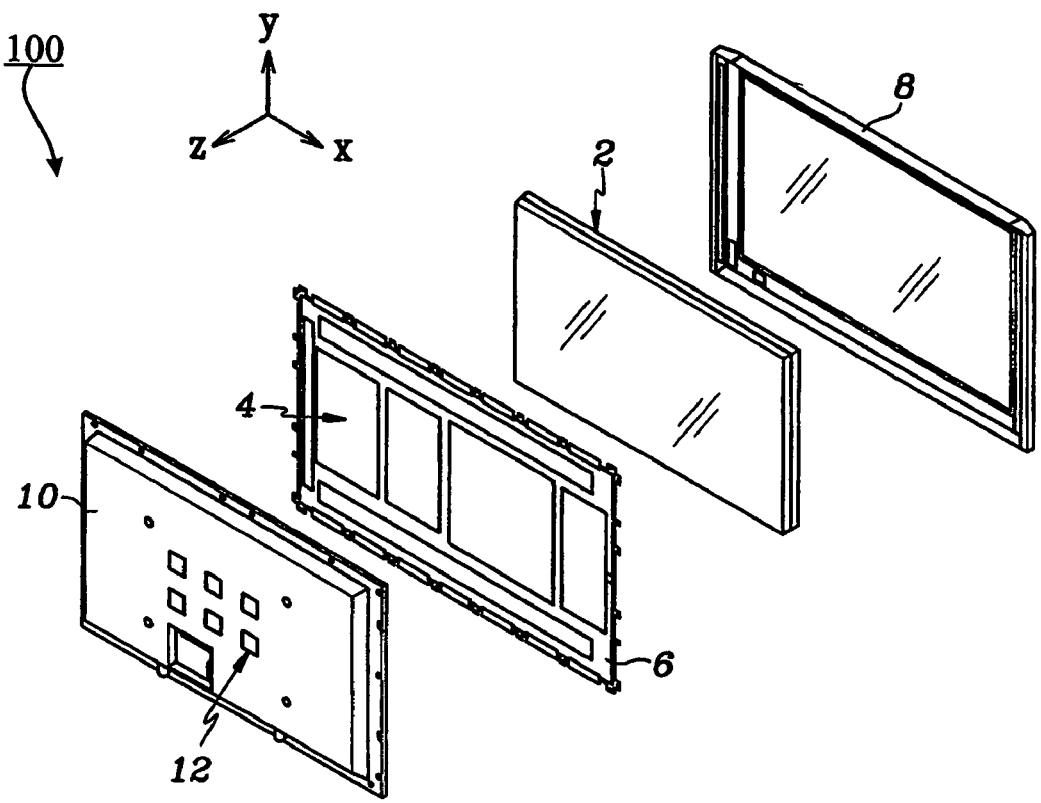
FIG. 1 is an exploded perspective view of a plasma display device according to embodiments of the present invention.

Turning now to the figures, FIG. 1 illustrates an exploded perspective view of a plasma display device 100 according to embodiments of the present invention. With reference to FIG. 1, the plasma display device 100 includes a plasma display panel (PDP) 2, a chassis base 6, a front cabinet 8, and a back cover 10. The PDP 2 displays images by a discharge mechanism occurring in discharge cells on a front side of PDP 2. The chassis base 6, on which a plurality of driving circuit boards 4 are mounted, fixedly supports the PDP 2 and is attached to a back side (+z side) of PDP 2. The front cabinet 8 is positioned on the front side (−z side) of the PDP 2 and the back cover 10 is positioned over chassis base 6 which covers the back side (+z side) of PDP 2. The back cover 10 is integrally assembled and connected to the front cabinet 8 with the chassis base 6 and the PDP 2 disposed in between.

The chassis base 6 has sufficient structural strength to support the PDP 2. The driving circuit boards 4 mounted on the chassis base 6 may include a power supply board, an image processing board, an address buffer board, a scanning electrode board, and a common electrode board.

In the plasma display device 100 of the present invention, a heat discharge assembly is provided to actively discharge heat generated by the PDP 2 and the driving circuit boards 4 to the exterior of the back cover 10 (i.e., outside the plasma display device). This allows the plasma display device 100 to expel heat from its interior. The heat discharge assembly is mounted, not within the display device, but within the back cover 10 itself such that a thickness of the display device 100 is not increased.

Figure 2:
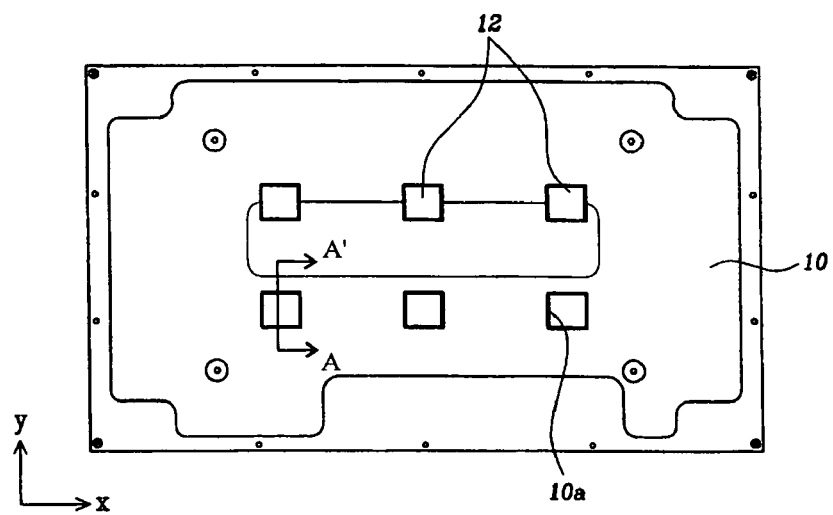
FIG. 2 is a perspective view of the back cover of FIG. 1.

Turning to FIGS. 1 and 2, FIGS. 1 and 2 illustrate a back cover 10 perforated by openings 10a where thermoelectric semiconductor devices 12 are arranged in the openings 10a of back cover 10. It is to be appreciated that back cover 10 is also perforated by ventilation openings (not illustrated) in addition to openings 10a. Ventilation openings allow hot air inside a functioning display 100 to exit the device 100 and allow cool air from an outside of device 100 to enter into an interior of the device 100 to replace the hot air that escaped. Preferably, the ventilation openings are small in size and large in number and can be formed in a honeycomb fashion in the back cover. It is to be appreciated that the ventilation openings are smaller than openings 10a that contain the thermoelectric semiconductor devices 12. It is also to be appreciated that back cover is preferably made out of metal and is preferably black in color.

It is further to be appreciated that FIGS. 1 and 2 illustrate the back cover 10 in the heat discharge assembly according to the first seven embodiments of the present invention (as illustrated by FIGS. 3, 7, 8, 9, 10, 11, 12A, 12B and 12C) and not according to the eighth through eleventh embodiments of the present invention (as illustrated by FIGS. 13 through 16). In the case of the eighth through eleventh embodiments, back cover 19 is used instead of back cover 10 in the plasma display device 100. Back cover 19 is different from back cover 10 in that back cover 19 does not have any large openings 10a that host the thermoelectric semiconductor devices 12. Instead, back cover 19 is perforated only by the small ventilation openings. Therefore, in the eighth through eleventh embodiments, the thermoelectric semiconductor devices 12 are disposed near or adjacent to back cover 19 instead of being located in openings in the back cover as in the first seven embodiments of the heat discharge assembly. Like back cover 10, back cover 19 is preferably made out of a metal and is preferably black in color.

Figure 3:
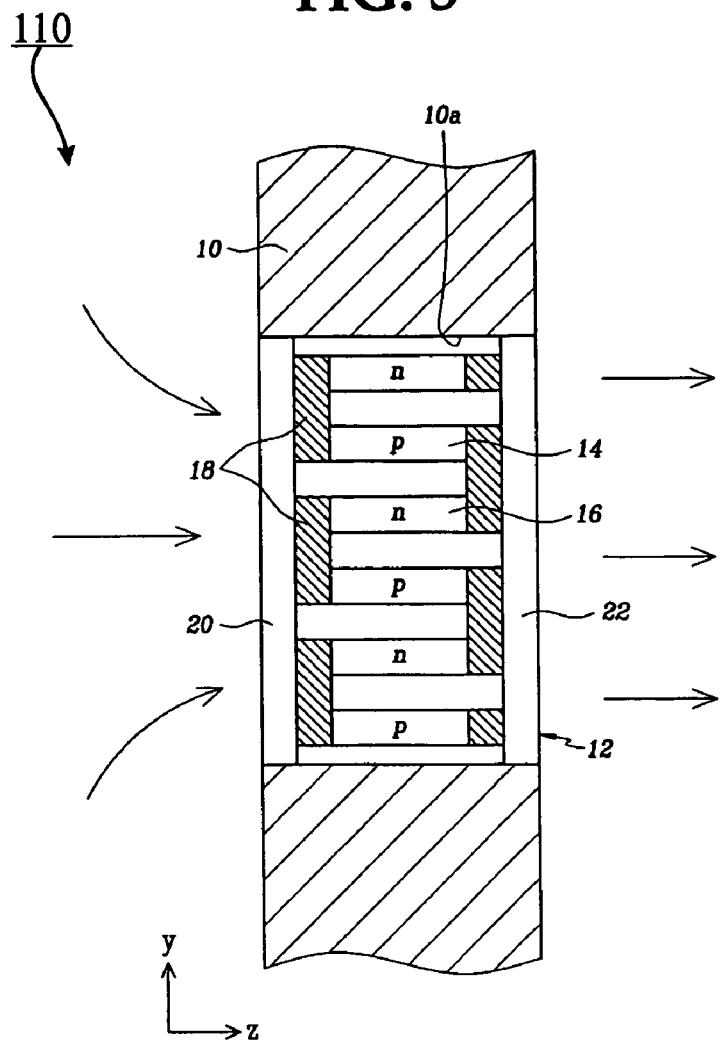
FIG. 3 is a sectional view taken along line A—A of FIG. 2 illustrating a heat discharge assembly according to a first embodiment of the present invention.

The heat discharge assembly according to the first seven embodiments will be described in greater detail with reference to FIG. 2, which is a perspective view of the back cover 10 of FIG. 1 (i.e., a view taken from a back side or +z-side looking in the −z direction) and FIG. 3 is a sectional view of heat discharge assembly 110 taken along line A–A' of FIG. 2 according to a first embodiment of the present invention. As illustrated in FIGS. 1 through 3, a plurality of thermoelectric semiconductor devices 12 are mounted in openings 10a in the back cover 10. The thermoelectric semiconductor devices 12 act to discharge or expel the heat generated by the PDP 2 and the driving circuit boards 4 to an outside the display device 100.

The thermoelectric semiconductor devices 12 are devices that utilize a thermal conduction property that either emits or absorbs heat (except for Joule heat) depending on the direction current flows in the thermoelectric semiconductor devices 12. The thermoelectric semiconductor devices 12 are able to control the amount of absorbed or emitted heat by adjusting the amount of current going through the device. Further, the side of back cover 10 from which heat is absorbed or emitted can be controlled by reversing the direction of current flowing through the thermoelectric semiconductor devices 12.

With respect to the location of the thermoelectric semiconductor devices 12, a plurality of passage openings 10a are formed in the back cover 10 at areas in the back cover 10 corresponding to portions of PDP 2 and driving circuit boards 4 that typically generate a lot of heat. The thermoelectric semiconductor devices 12 are located in openings 10a of back cover 10.

Turning now to FIG. 3, FIG. 3 illustrates a cross section of a heat discharge assembly 110 according to a first embodiment of the present invention. As illustrated in FIG. 3, each thermoelectric semiconductor device 12 has a p-type semiconductor 14 and n-type semiconductor 16 with metal strips 18 in between adjacent p and n-type semiconductors, a heat absorbing surface 20 and a heat emitting surface 22. The p-type semiconductor 14, the n-type semiconductor 16 and the metal strips 18 are electrically connected to each other in series. The metal strips 18 along one end (the −z end or the chassis base 6 side) of the p-type semiconductors 14 and the n-type semiconductors 16 are in contact with the heat absorbing surface 20. The metal strips 18 along opposite ends (the +z end or the outside side) of the p-type semiconductors 14 and the n-type semiconductors 16 are in contact with the heat emitting surface 22. Thus heat absorbing surface 20 and the heat emitting surface 22 are positioned respectively adjacent to the chassis base 6 and toward the exterior of the plasma display device 100, respectively. That is, the heat absorbing surface 20 is closest to the PDP 2 and the heat emitting surface is exposed to an exterior (+z side) of back cover 10.

Figure 4:
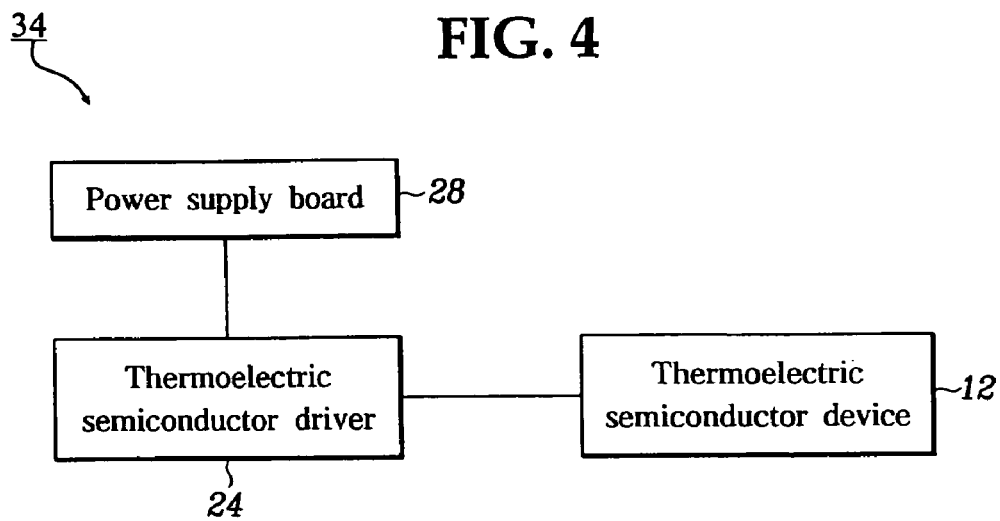
FIG. 4 is a block diagram of circuitry connected to thermoelectric semiconductor devices used in the plasma display device of FIG. 1 according to a first embodiment of the present invention.

Turning now to FIG. 4, FIG. 4 illustrates the electrical interconnections of circuits 34 connected to the thermoelectric semiconductor devices 12 according to a first embodiment of the present invention. As illustrated in FIG. 4, each of the thermoelectric semiconductor devices 12 are connected to a power supply board 28 through a thermoelectric semiconductor driver 24. The thermoelectric semiconductor devices 12 receive current required to perform heat discharge from the power supply board 28 during operation of the plasma display device 100. In more detail, if current is supplied to the thermoelectric semiconductor devices 12 from the power supply board 28 during operation of the display device 100, the thermoelectric semiconductor devices 12 absorb heat generated in the PDP 2 and the driving circuit boards 4 through the heat absorbing surfaces 20, which are positioned on a side of the back cover 10 (−z side) adjacent to the chassis base 6. The absorbed heat is then discharged outside the display device through the heat emitting surfaces 22, which are positioned on a side (+z side) of the back cover 10 facing away from chassis base 6 (i.e., toward an exterior of the back cover 10), thereby reducing the internal temperature of the display device 100 during display device operation. This way, by mounting the thermoelectric semiconductor devices 12 in the openings 10a of back cover 10, the heat discharge characteristics of the display device are enhanced without increasing the size of the display 100, without using noisy fans, and without compromising the display's ability to block unwanted electromagnetic noise and electromagnetic interference from leaving the display 100 and without disrupting the operation of other electrical equipment in the vicinity of the display. Further, since the thermoelectric semiconductor devices 12 of the present invention have no moving mechanical parts, their structure is simple, there is no need for repeated maintenance during the life of the display 100 that mechanical fans require.

Figure 5:
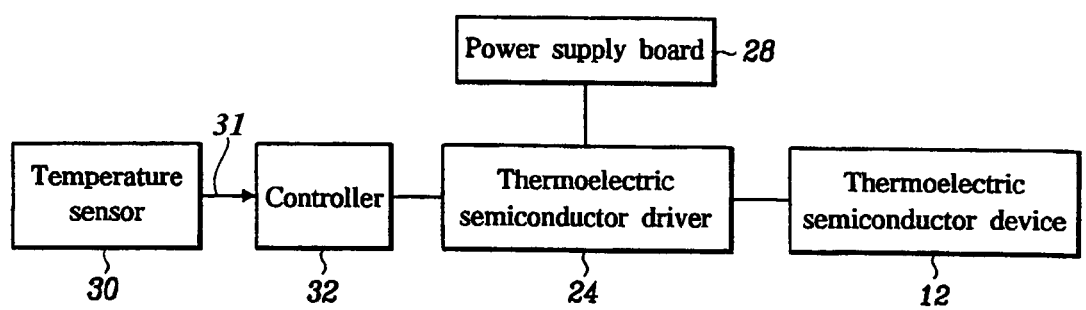
FIG. 5 is a block diagram of additional circuitry that may also be connected to the thermoelectric semiconductor devices according to a second embodiment of the present invention.
Figure 6:
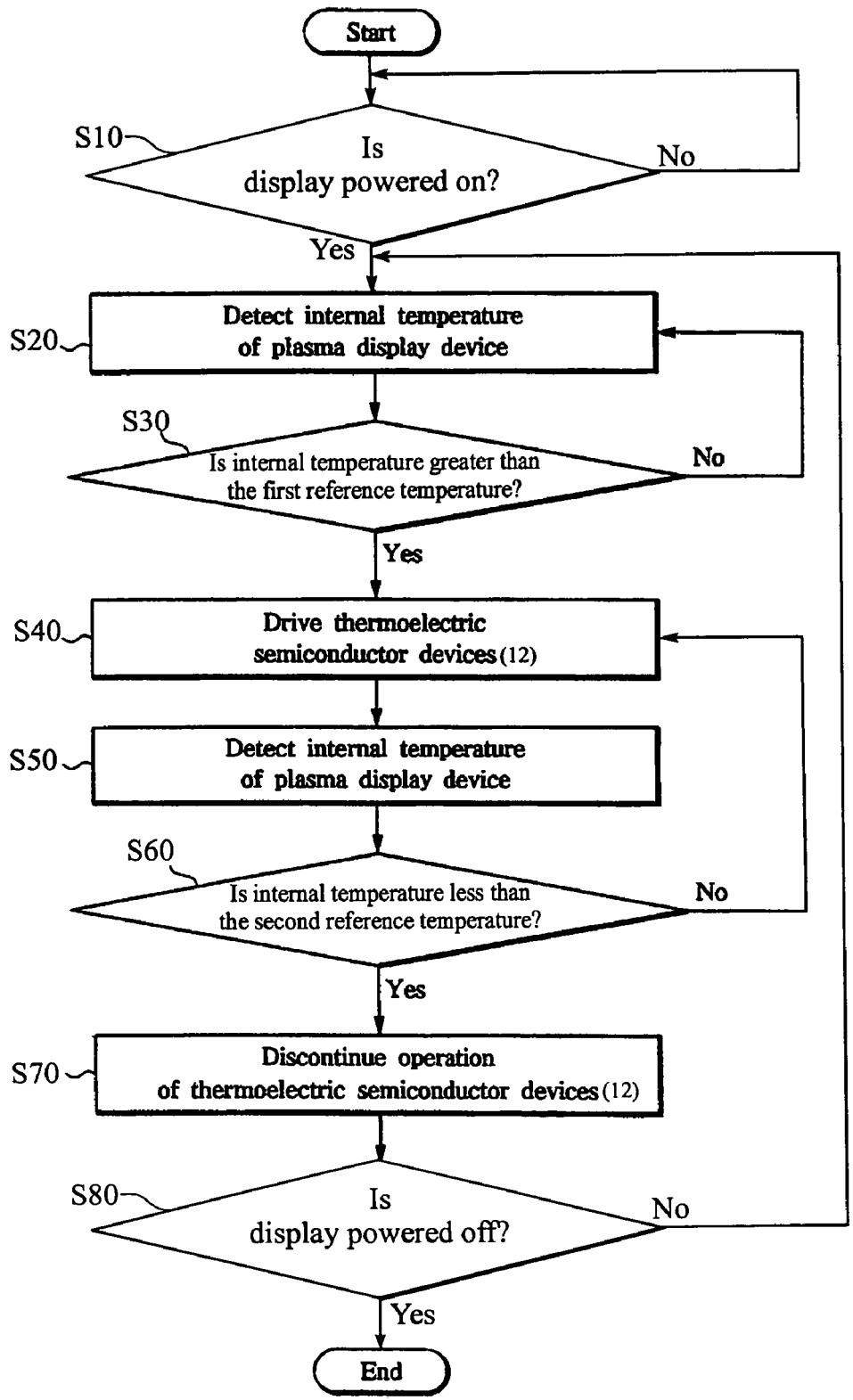
FIG. 6 is a flow chart of operational processes of the circuitry of FIG. 5.

Turning now to FIG. 5, FIG. 5 illustrates electrical interconnections 35 inside the plasma display device 100 according to a second embodiment of the present invention and FIG. 6 illustrates a method of controlling the temperature inside the display according to the present invention using the electrical interconnections of FIG. 5. FIG. 5 includes the electrical components of FIG. 4 but also includes a controller 32 and a temperature sensor 30. Temperature sensor 30 of FIG. 5 is used to detect the internal temperature of the plasma display device 100. Controller 32 of FIG. 5 is used to control the temperature inside the display 100 according to the method or flowchart of FIG. 6. Temperature sensor 30 outputs signals 31 to controller 32. These signals 31 correspond to an internal temperature sensed inside the plasma display device 100. Controller 32 receives these signals 31 from temperature sensor 30 and then controls the operation of thermoelectric semiconductor devices 12 based on the signals 31 received from the temperature sensor 30.

Turning now to FIG. 6, FIG. 6 illustrates a method in a flowchart for how the apparatus of FIGS. 1 and 5 can control the internal temperature of a functioning plasma display panel 100. As illustrated in FIG. 6, it is first determined in step S10 whether or not the plasma display panel 100 is turned on. If the plasma display panel 100 is turned on, the temperature sensor 30, in step S20 first detects the internal temperature of the plasma display device and outputs corresponding temperature signals 31 to controller 32 in step S20. Using these temperature signals 31, the controller 32 then compares the internal temperature of the plasma display device with a first reference temperature in step S30. If the internal temperature of the plasma display device is greater than the first reference temperature, the controller 32 electrically interconnects the power supply board 28 to the thermoelectric semiconductor devices 12 to thereby drive the thermoelectric semiconductor devices 12 in step S40. The operation of the thermoelectric semiconductor devices 12 results in cooling the interior of the plasma display device. However, if the temperature sensed inside the plasma display panel is less than the first reference temperature at step S30, the thermoelectric semiconductor devices 12 are not powered on. Instead, the controller 32 and temperature sensor 30 continue to monitor the temperature inside the plasma display (steps S20 and S30) by continually receiving signals 31 from temperature sensor 30 until the temperature sensed inside the plasma display exceeds the first reference temperature.

While the thermoelectric semiconductor devices 12 are being driven in step S40, the temperature sensor 30 again continues to detect the internal temperature of the plasma display device and outputs corresponding temperature signals 31 to the controller 32 in step S50. The controller 32 uses the received temperature signals 31 output by the temperature sensor 30 to determine whether the internal temperature of the plasma display device is less than a second reference temperature in step S60. If the internal temperature of the plasma display device is less than the second reference temperature at step S60, the controller 32 disconnects the thermoelectric semiconductor devices 12 from the power supply board 28 to thereby discontinue operation of the thermoelectric semiconductor devices 12 in step S70. If however the temperature sensed inside the display at step S60 is greater than the second reference temperature, the control goes back to step S40 where controller 32 continues to allow power supply 28 to drive the thermoelectric semiconductor devices 12 until the temperature inside the display falls to less than the second reference temperature. After the temperature inside the display falls to a temperature less than the second reference temperature and the power supply 28 stops supplying power to the thermoelectric semiconductor device, the above process is repeated provided that the plasma display is still powered on (step S80).

In the above process of FIG. 6, the first reference temperature used to determine whether to initiate the driving of the thermoelectric semiconductor devices 12 is preferably between 55 and 65° C. The second reference temperature used to determine whether to discontinue operation of the thermoelectric semiconductor devices 12 is preferably less than the first reference temperature and is preferably between 50 and 60° C. As an example, the first reference temperature may be set at 57° C. and the second reference temperature at 53° C. Through this operation of the above method of FIG. 6, the internal temperature of a functioning plasma display device may be maintained in a range of 50~65° C., preferably 50~60° C. Therefore, a reduction in performance and reliability of the circuit elements caused by excess heat in a functioning plasma display device may be prevented.

Figure 7:
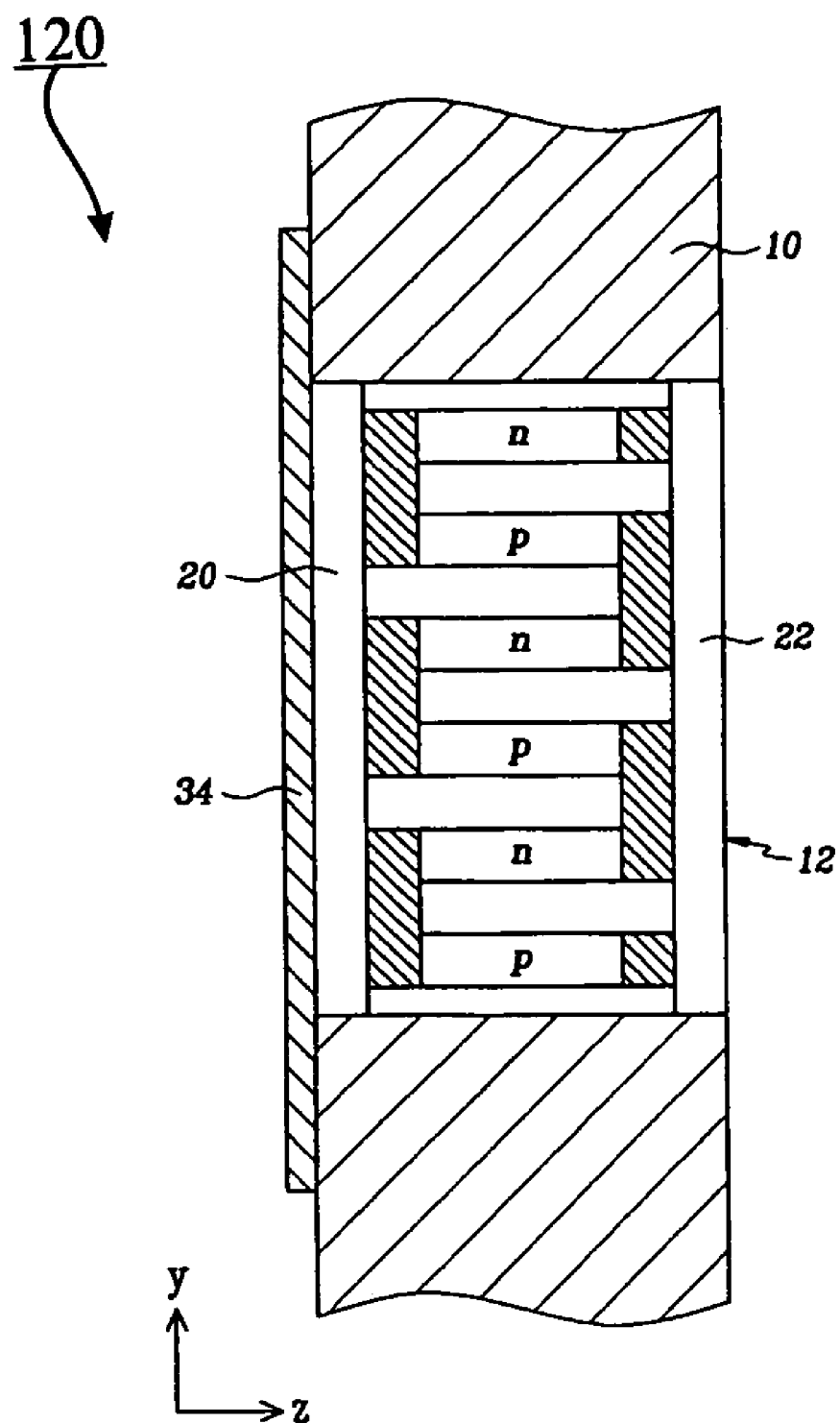
FIG. 7 is a sectional view taken along line A—A of FIG. 2 illustrating the a heat discharge assembly according to a second embodiment of the present invention.

Turning now to FIG. 7, FIG. 7 illustrates a heat discharge assembly 120 according to a second embodiment of the present invention. In the heat discharge assembly 120 of FIG. 7, a thin metal plate 34 (e.g., a thin aluminum or copper plate) having an area greater than that of opening 10a and is positioned over heat absorbing surface 20 on an inside side (−z side) of back cover 10. The thermoelectric semiconductor devices 12 are attached over an opposite surface of the heat absorbing surface 20 of the thermoelectric semiconductor devices 12. As a result, the heat of the air inside the display device using heat discharge assembly 120 has been warmed during device operation, has a larger area to which it can be transferred than heat discharge assembly 110 of the first embodiment of the present invention. In effect, this heated air in the second embodiment is in contact with the thermoelectric semiconductor devices 12 over a larger area. The thin metal plate 34, therefore, enhances the heat absorbing capability of the thermoelectric semiconductor devices 12. The thin metal plate 34 is preferably black in order to enhance the absorbing capability of radiant heat.

Figure 8:
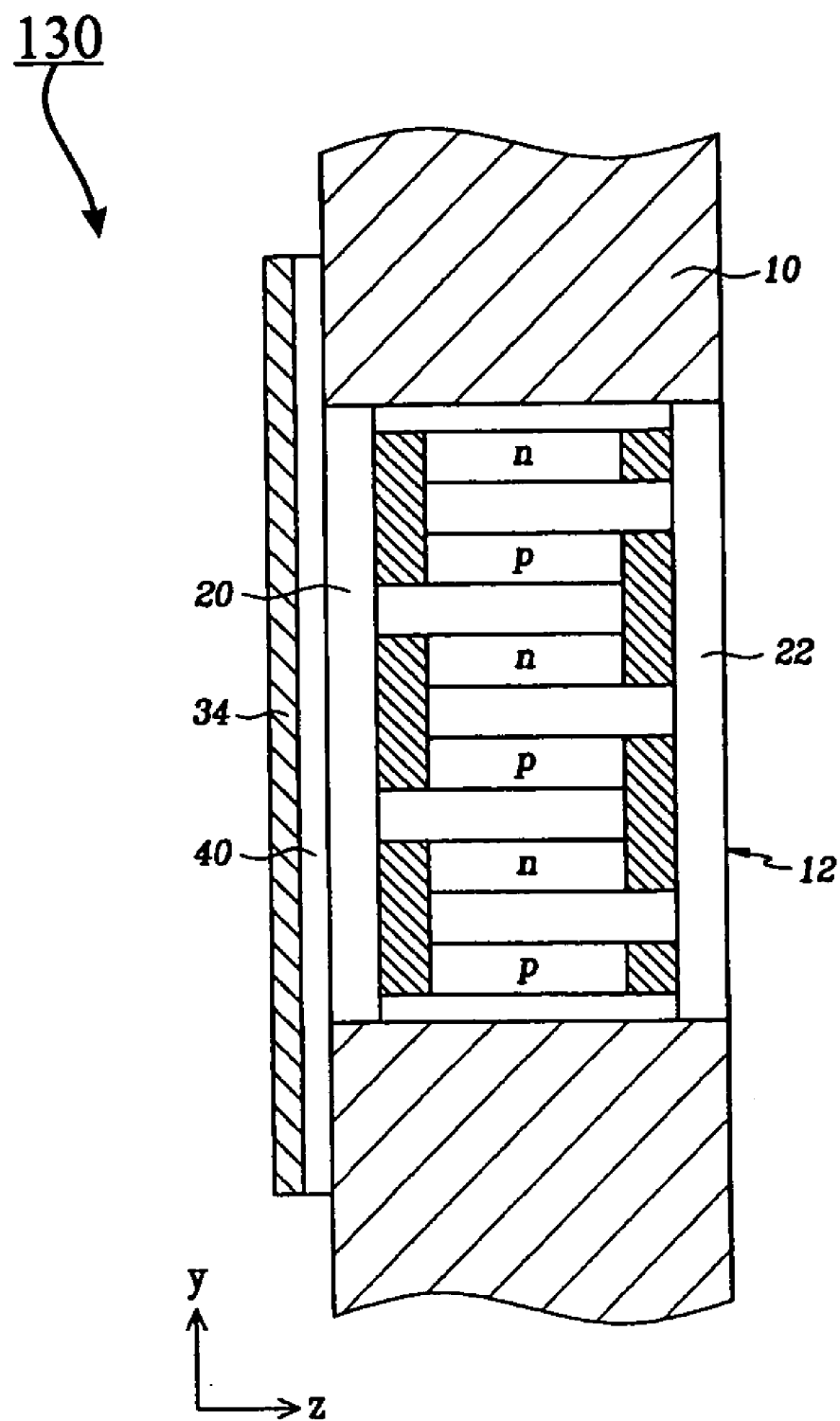
FIG. 8 is a sectional view taken along line A—A of FIG. 2 illustrating the a heat discharge assembly according to a third embodiment of the present invention.

Turning now to FIG. 8, FIG. 8 illustrates a heat discharge assembly 130 according to a third embodiment of the present invention. Heat discharge assembly 130 is similar to heat discharge assembly 120 in FIG. 7 except that heat discharge assembly 130 further includes a thermal conduction member 40 arranged between the thin metal plate 34 and the heat absorbing surface 20. As illustrated in FIG. 8, the thermal conduction member 40 has an area equal to the area of thin metal plate 34. The thermal conduction member 40 serves to reduce heat resistance between the thermoelectric semiconductor device 12 and the thin metal plate 34. Preferably, thermal conduction member 40 is made out of either silicon or a thin carbon sheet. A thermal grease (not illustrated) may be deposited on the thermal conduction member 40 for enhancing the capability of the thermal conduction member 40.

Figure 9:
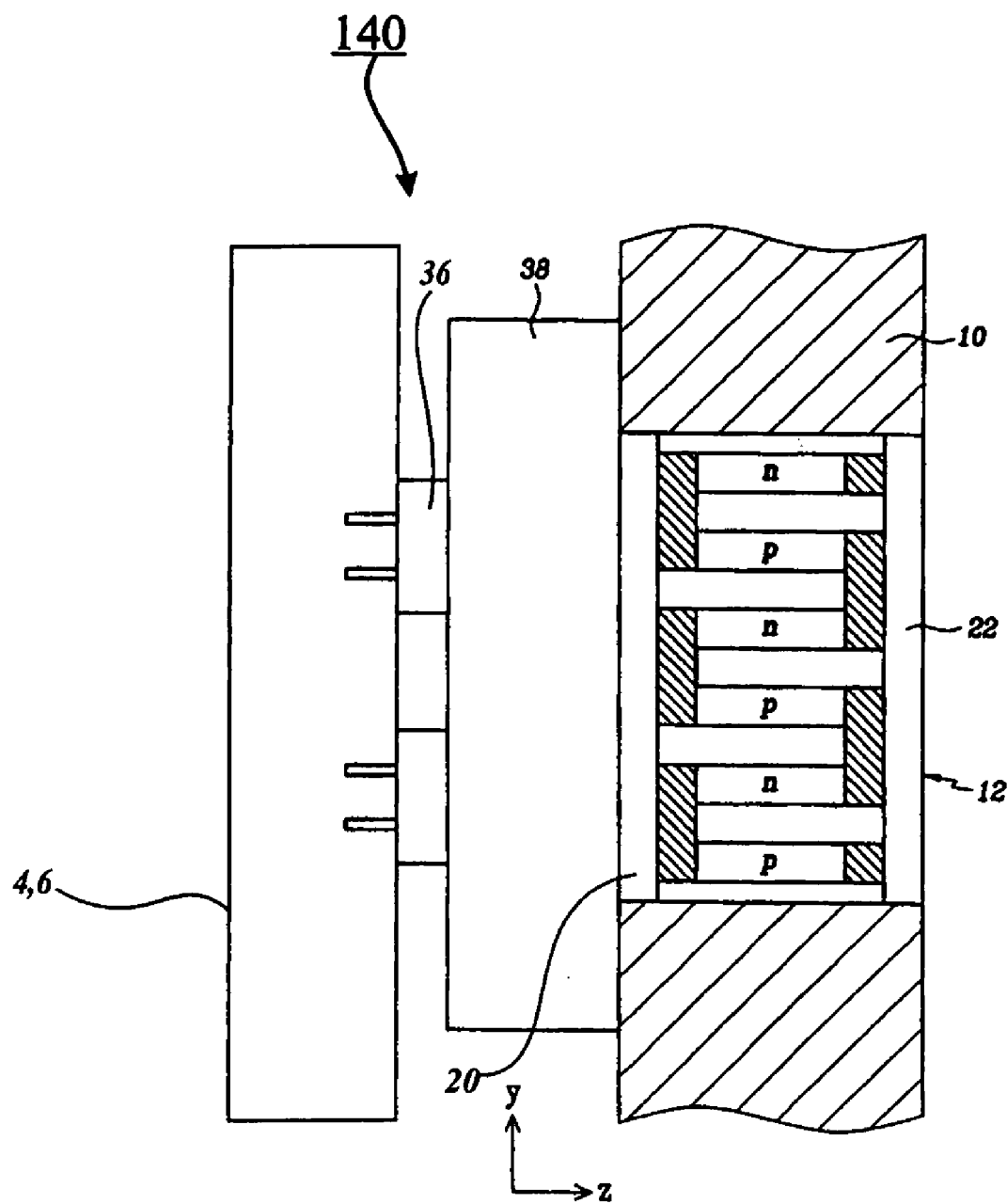
FIG. 9 is a sectional view taken along line A—A of FIG. 2 illustrating the a heat discharge assembly according to a fourth embodiment of the present invention.
Figure 10:
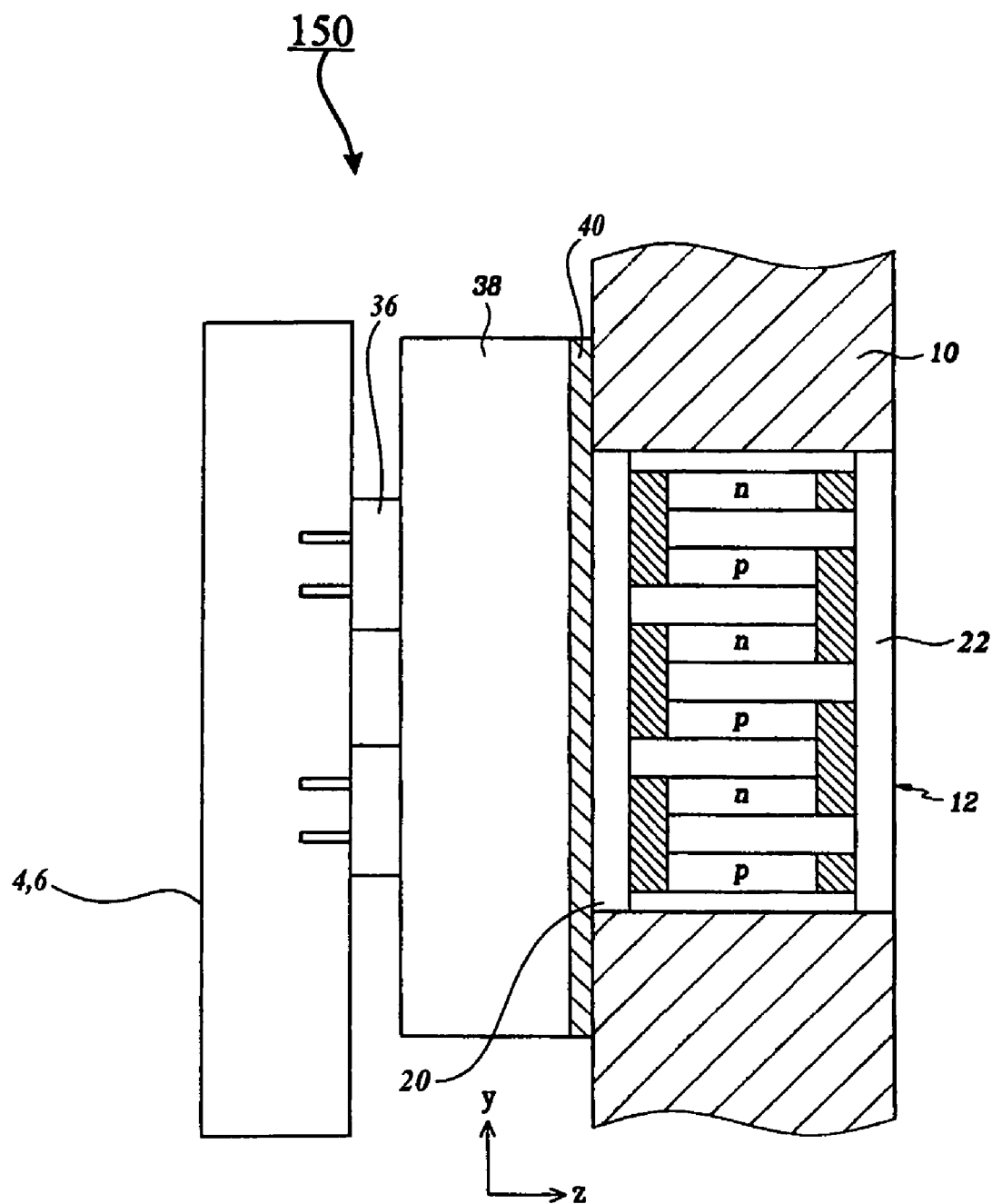
FIG. 10 is a sectional view taken along line A—A of FIG. 2 illustrating the a heat discharge assembly according to a fifth embodiment of the present invention.

Turning now to FIG. 9, FIG. 9 illustrates a heat discharge assembly 140 according to a fourth embodiment of the present invention. In the fourth embodiment illustrated in FIG. 9, the heat discharge assembly 140 is similar to heat discharge assembly 110 of the first embodiment except that the heat discharge assembly 140 also includes a heat sink 38 attached to the −z side (or the side having the heat absorbing surface 20). Also illustrated in FIG. 9 are FETs 36 attached to the heat sink 38. FETs 36 are circuit elements on driving circuit boards 4 on chassis base 6. FETs 36 are illustrated in FIGS. 9 and 10 because FETs 36 are switched on and off often in the driving of the thermoelectric semiconductor devices 12 and thus FETs 36 generate a lot of heat compared to other elements on driving circuit boards 4. Because FETs 36 generate a lot of heat, FIGS. 9 and 10 illustrate FETs 36 in direct contact with heat sink 38. The heat sinks 38 discharge heat away from the driving circuit boards 4, and, in particular, of elements such as FETs (field effect transistors) 36.

Turning now to FIG. 10, FIG. 10 illustrates heat discharge assembly 150 according to a fifth embodiment of the present invention. The heat discharge assembly 150 of FIG. 10 is similar to the heat discharge assembly 140 of FIG. 9 except that heat discharge assembly 150 of FIG. 10 also includes a thermal conduction member 40 (e.g., a heat discharge sheet) between the heat absorbing surface 20 of thermoelectric semiconductor device 12 and the heat sink 38 on thermal conduction member 40 on the −z side or inside side of back cover 10. That is, one thermal conduction member 40 is interposed between each pair of the heat sinks 38 and the heat absorbing surfaces 20 of the thermoelectric semiconductor devices 12 in openings 10a of back cover 10 in heat discharge assembly 150 of FIG. 10. Preferably, thermal conduction member 40 is made out of either silicon or a thin carbon sheet. The ability of the thermoelectric semiconductor devices 12 to absorb heat is improved by the addition of the heat sinks 38 contacting the heat absorbing surfaces 20 of the thermoelectric semiconductor devices 12 as in the fourth embodiment of FIG. 9, and by the interposing of the thermal conduction members 40 between the heat sinks 38 and the heat absorbing surfaces 20 as in the fifth embodiment of FIG. 10.

Figure 11:
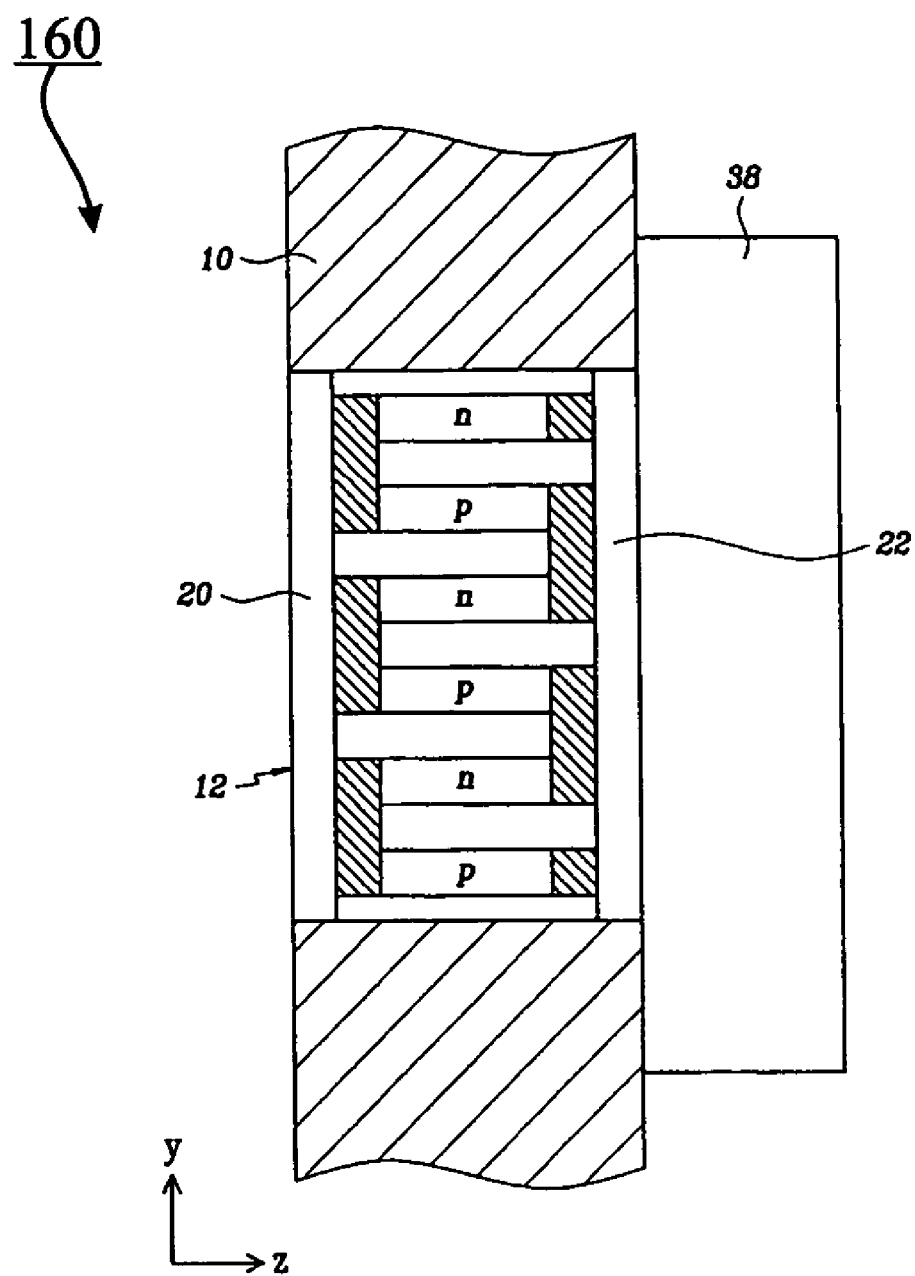
FIG. 11 is a sectional view taken along line A—A of FIG. 2 illustrating the a heat discharge assembly according to a sixth embodiment of the present invention.

Turning now to FIG. 11, FIG. 11 illustrates a heat discharge assembly 160 according to a sixth embodiment of the present invention. Unlike the heat discharge assembly 140 of the fourth embodiment of FIG. 9, the heat discharge assembly 160 of the sixth embodiment of the present invention has the heat sink 38 on the +z side or on the outside side of the back cover 10. In FIG. 11, a heat sink 38 is contacted to an exterior surface of each of the heat emitting surfaces 22 of the thermoelectric semiconductor devices 12. By mounting the heat sinks 38 to the exterior surfaces (or +z side of back cover 10) of the heat emitting surfaces 22, the ability of the thermoelectric semiconductor devices 12 to discharge heat is increased.

Figure 12A:
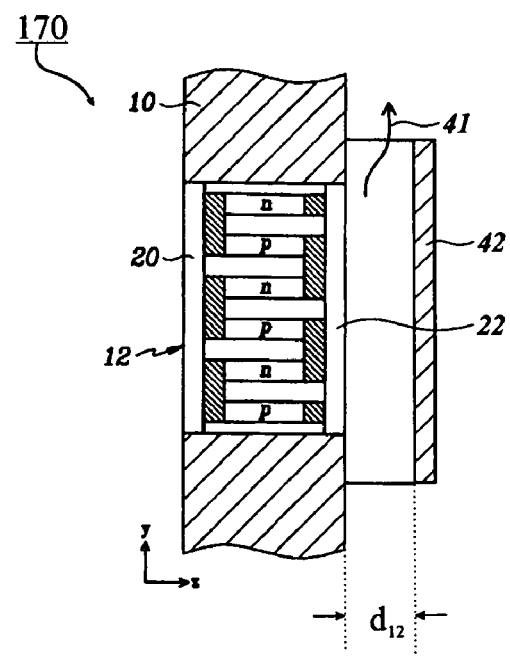
FIG. 12A is a sectional view taken along line A—A of FIG. 2 illustrating the a heat discharge assembly according to a seventh embodiment of the present invention.

Turning now to FIG. 12A, FIG. 12A illustrates a heat discharge assembly 170 according to a seventh embodiment of the present invention. In the heat discharge assembly 170 of FIG. 12A, an insulating cover 42 is positioned over heat emitting surface 22 on a +z side or on the exterior side of back cover 10. The insulating cover 42 provides spaces 41 through which heat emitted from the heat emitting surfaces 22 escapes while simultaneously safely covering the high temperature heat emitting surfaces 22 from being accidently touched. As an example, each of the insulating covers 42 may be mounted to the back cover 10 at a predetermined distance $d_{12}$ from the exterior side or +z side of back cover 10. Insulating cover 42 is generally made out of the same material as back cover 10 which is a metal, but the present invention is in no way limited thereto. Insulating cover 42 has two sides, an inside side that faces thermoelectric semiconductor devices 12 and an outside side that faces in the +z direction away from back cover apparatus 170.

Figure 12B:
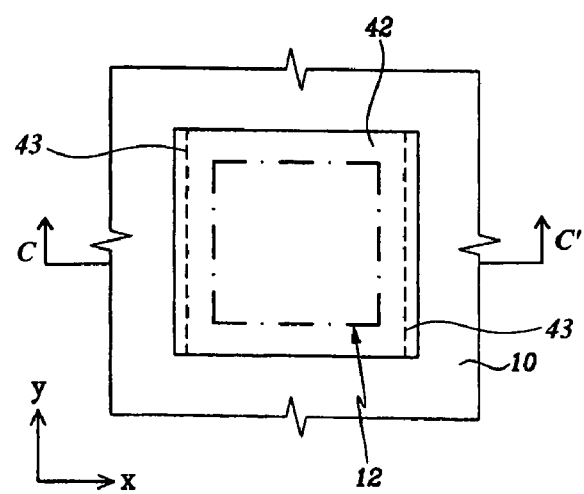
FIG. 12B illustrates a view of the heat discharge assembly having the insulating cover of FIG. 12A according to the seventh embodiment of the present invention.

Turning now to FIG. 12B, FIG. 12B illustrates the heat discharge assembly 170 of FIG. 12A looking in a −z direction from an exterior side (or +z side) of back cover 10. As illustrated in FIG. 12B, the insulating cover 42 covers an area larger than the exposed surface area of heat emitting surface 22 of thermoelectric semiconductor devices 12. Connectors 43 (illustrated in FIG. 12B as dotted lines) serve to attach insulating cover 42 to the back cover 10. Connectors 43 extend in a −/+y direction and do not extend in a −/−x direction. Therefore, connectors 43 are not disposed along a top side or a bottom side of insulating cover 42. This allows hot air to rise and escape through vent 41 on a top side of insulating cover 42 without being blocked by a connector 43. This also allows cool air to filter in along a bottom edge of insulating cover 42 to replace the hot air that escaped upward in a +y direction.

Figure 12C:
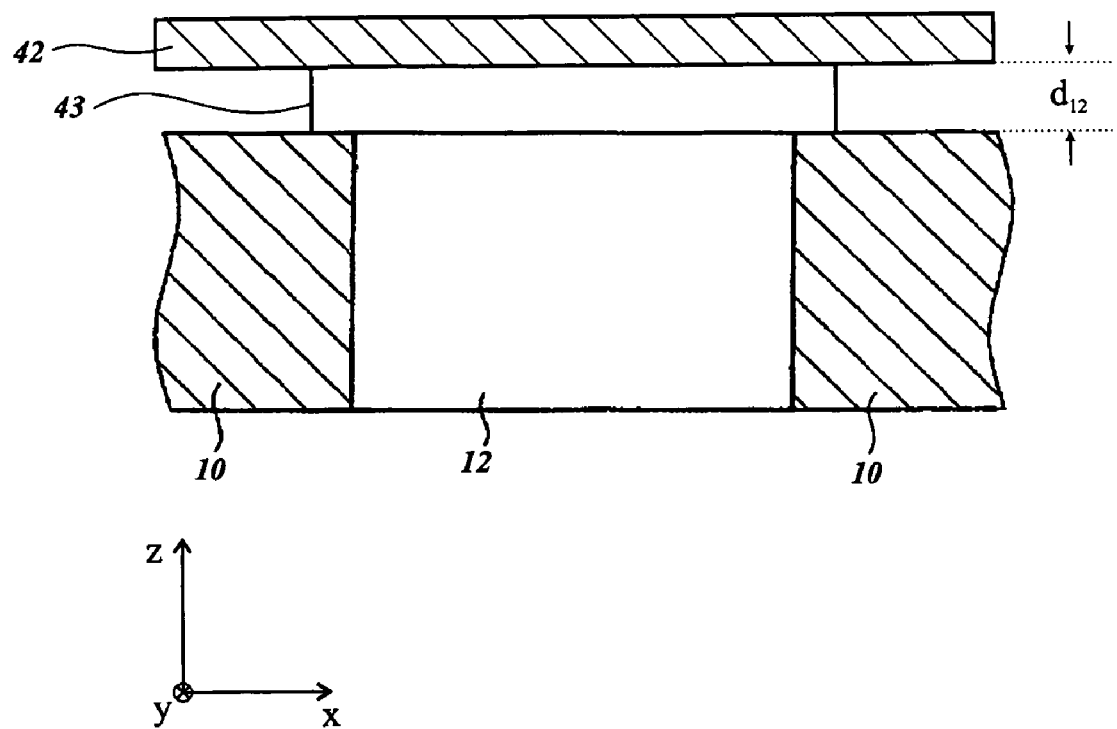
FIG. 12C illustrates a cross section of the heat discharge assembly of FIGS. 12A and 12B taken along the C–C' direction.

Turning now to FIG. 12C, FIG. 12C illustrates heat discharge assembly 170 of FIG. 12B taken along direction C–C' of FIG. 12B. In other words, FIG. 12C is heat discharge assembly 170 looking in a +y direction. As illustrated in FIG. 12C, the connectors 43 are arranged at either side of insulating cover 42 to allow hot air to escape unhindered out a top +y side of insulating cover 42 through vent 41.

Figure 13:
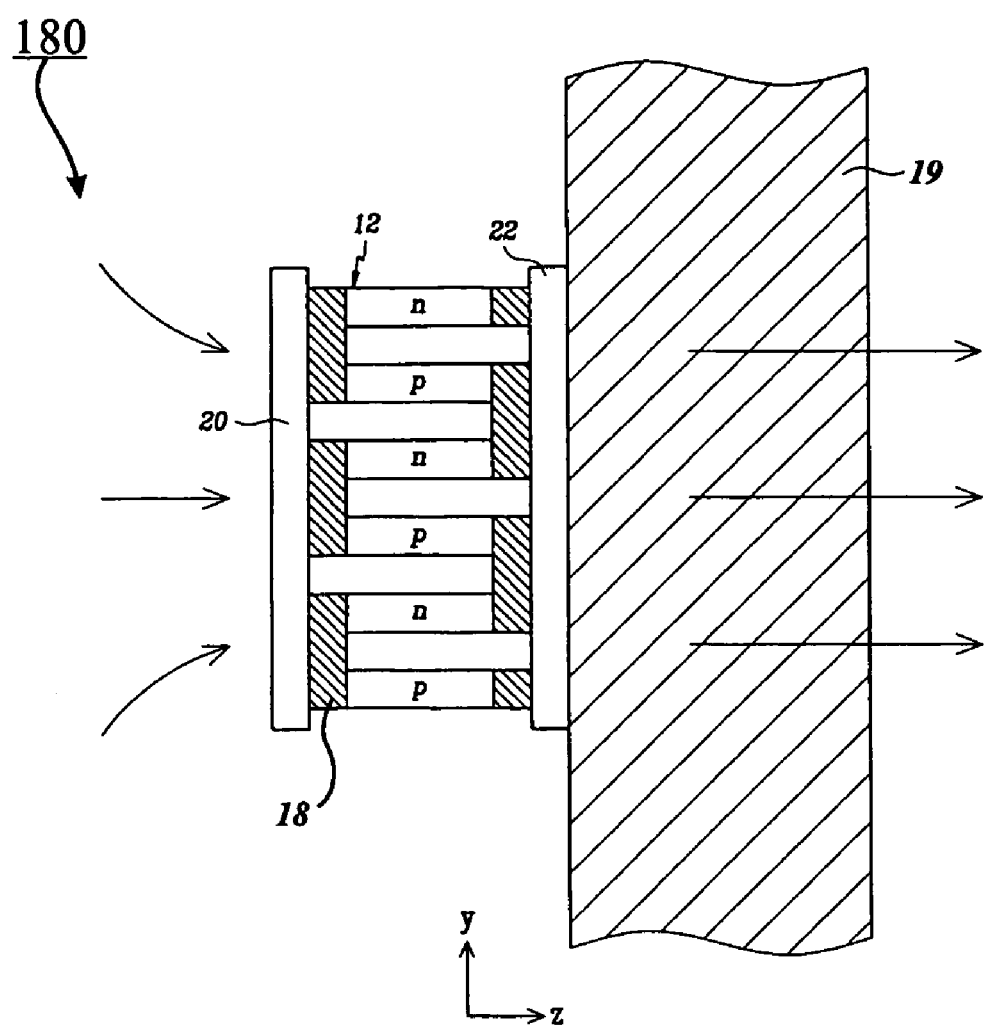
FIG. 13 illustrates a sectional view of a heat discharge assembly with a solid back cover according to an eighth embodiment of the present invention.

Turning now to FIG. 13, FIG. 13 illustrates a heat discharge assembly 180 according to an eighth embodiment of the present invention. In FIG. 13, the back cover 19 is solid and is not perforated by openings 10a as in the back cover 10 illustrated in the first seven embodiments of the present invention. In FIG. 13, the thermoelectric semiconductor devices 12, the metal strips 18, the heat absorbing surface 20 and the heat emitting surface 22 are formed on an inside side or −z side of back cover 19 as opposed to being located inside an opening in the back cover. Although back cover 19 is absent openings 10a that host thermoelectric semiconductor devices 12, back cover 19, like back cover 10, is perforated by a large number of relatively small ventilation holes (not illustrated) to allow hot air to leave the display device and to allow cool air to enter the display device and replace the escaped hot air.

In the case of the eighth embodiment illustrated in FIG. 13, the thermoelectric semiconductor devices 12 are mounted to the inner surface (−z side) of the back cover 19 such that their heat emitting surfaces 22 contact the back cover 19. As a result, heat generated in the display device is discharged to outside the display device after first being induced to pass through the back cover 19 as illustrated by the arrows in FIG. 13.

Figure 14:
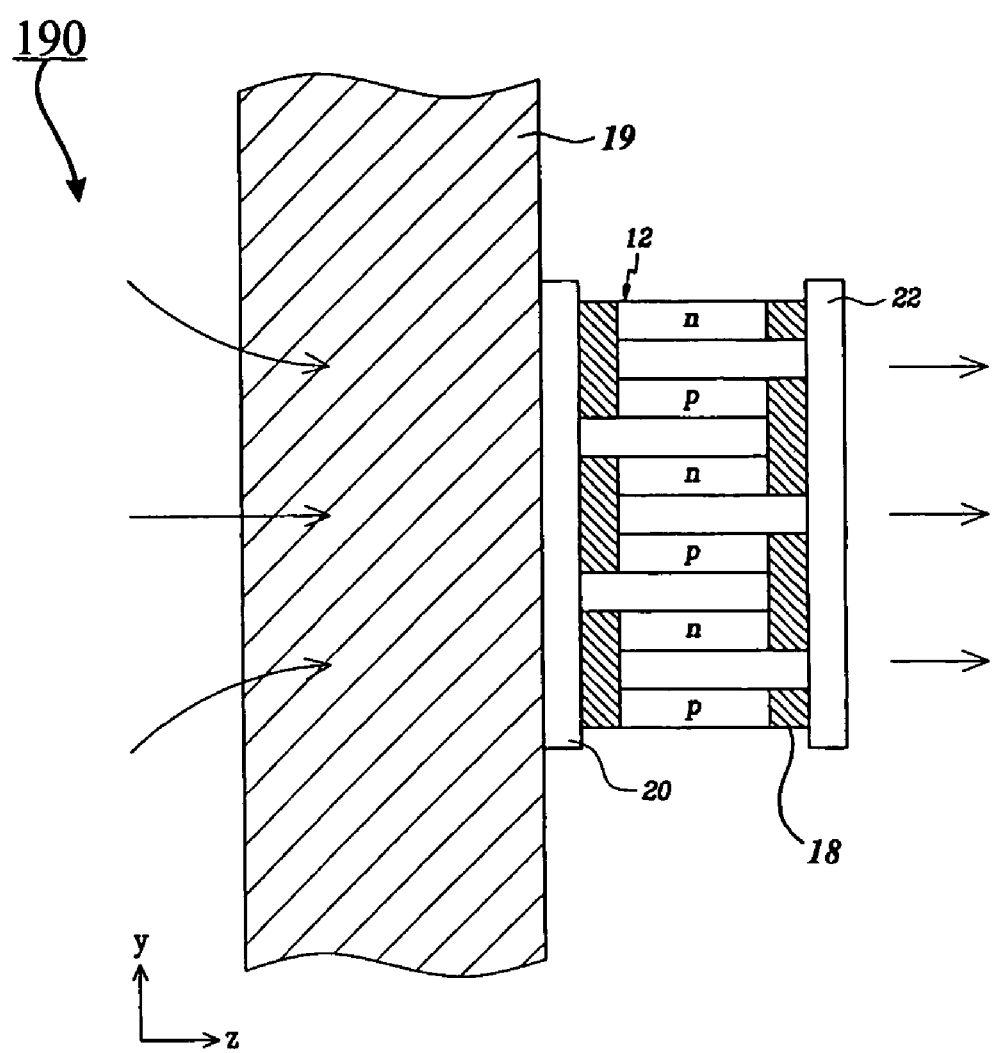
FIG. 14 illustrates a sectional view of a heat discharge assembly having a solid back cover according to a ninth embodiment of the present invention.

Turning now to FIG. 14, FIG. 14 illustrates a heat discharge assembly 190 according to a ninth embodiment of the present invention. Heat discharge assembly 190 of FIG. 14 is similar to heat discharge assembly 180 of FIG. 13 in that back cover 19 does not have any openings 10a that host thermoelectric semiconductor device 12 but still is perforated by relatively smaller ventilation holes. Heat discharge assembly 190 is also similar to heat discharge assembly 180 of FIG. 13 in that the thermoelectric semiconductor devices 12, the metal strips 18, the heat absorbing surface 20 and the heat emitting surface 22 are located next to as opposed to within the back cover 19. Heat discharge assembly 190 of FIG. 14 differs from heat discharge assembly 180 of FIG. 13 in that the thermoelectric semiconductor devices 12, the metal strips 18, the heat absorbing surface 20 and the heat emitting surface 22 are formed on an outside side or +z side of back cover 19 as opposed to being located on an interior side or surface (−z side) of back cover 19.

As illustrated in FIG. 14, the thermoelectric semiconductor devices 12 are mounted to the outer surface (or +z side) of the back cover 19 such that the heat absorbing surfaces 20 (and not the heat emitting surfaces 22 as in FIG. 13) contact the exterior side (or +z side) of back cover 19. Therefore, heat transmitted through the back cover 19 is expelled to outside the display device through the thermoelectric semiconductor devices 12 as illustrated by the arrows in FIG. 14.

Figure 15:
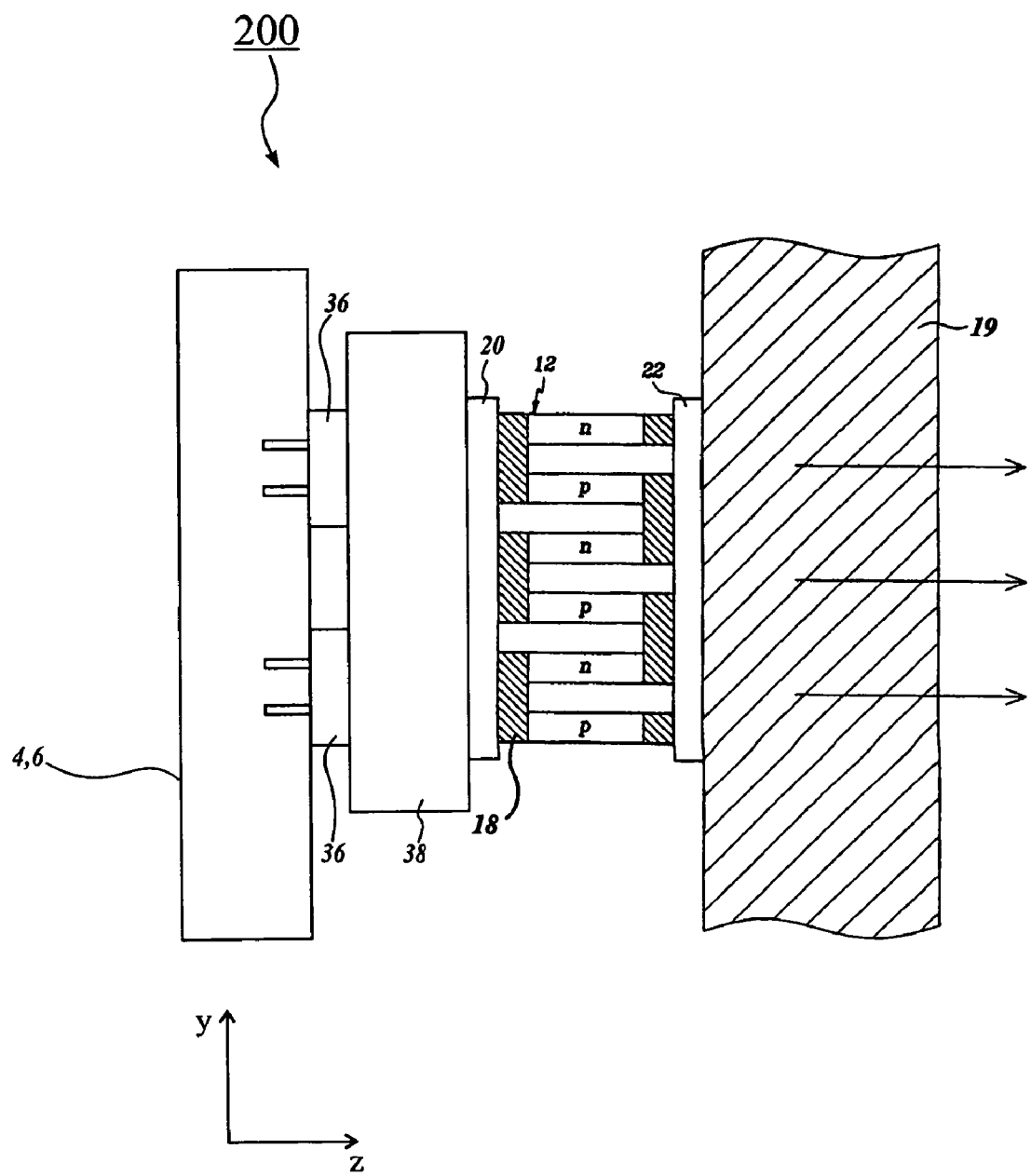
FIG. 15 illustrates a sectional view of a heat discharge assembly having a solid back cover according to a tenth embodiment of the present invention.

Turning now to FIG. 15, FIG. 15 illustrates a heat discharge assembly 200 according to a tenth embodiment of the present invention. The heat discharge assembly 200 of FIG. 15 is essentially heat discharge assembly 180 of FIG. 13 modified to also have the heat sink 38 attached to FETs 36 on driving circuit boards 4 on chassis base 6.

As illustrated in FIG. 15, heat discharge assembly 200 uses a back cover 19 absent the large openings 10a found on the heat discharge assembly of the first seven embodiments. Therefore, thermoelectric semiconductor devices 12 are placed adjacent to back cover 19 as opposed to being within openings 10a in the back cover. Thermoelectric semiconductor devices 12 are on the −z side or the display side of the back cover 19. It is the heat emitting surface 22 of the thermoelectric semiconductor devices 12 that is in contact to the back cover 19. On the other side (the −z side) of thermoelectric semiconductor devices 12 is a heat absorbing surface 20 that is in contact with heat sink 38. Heat sink 38 is also in contact with circuit elements (i.e., FETs 36 illustrated in FIG. 15) found on driving circuit boards 4 of chassis base 6. Since FETs 36 generate a lot of heat, FIG. 15 illustrates FETs 36 of driving circuit board 4 attached to heat sink 38. As illustrated in FIG. 15, arrows move from left to right (in a +z direction) and illustrate the direction heat flows in the heat discharge assembly 200 of FIG. 15.

Figure 16:
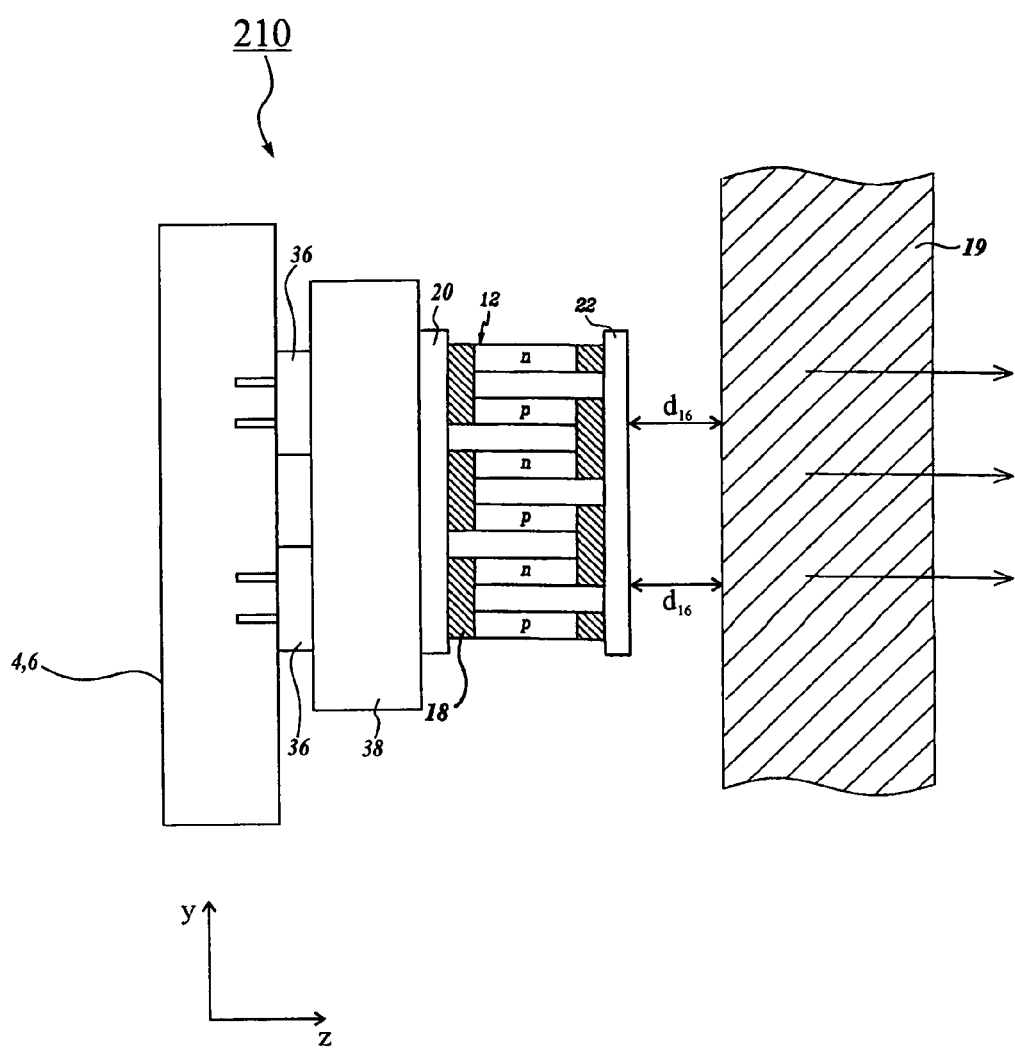
FIG. 16 illustrates a sectional view of a heat discharge assembly having a solid back cover according to a eleventh embodiment of the present invention.

Turning now to FIG. 16, FIG. 16 illustrates a heat discharge assembly 210 according to an eleventh embodiment of the present invention. The heat discharge assembly 210 of FIG. 16 is similar to the heat discharge assembly 200 of FIG. 15 except that in FIG. 16, the heat emitting surface 22 of thermoelectric semiconductor devices 12 does not contact back cover 19 but instead is separated from back cover 19 by a predetermined distance $d_{16}$. Since the thermoelectric semiconductor devices 12 are not in contact with back cover 19 in FIG. 16, the thermoelectric semiconductor devices 12 do not directly heat up the back cover 19 but, instead heat the air between the back cover 19 and the thermoelectric semiconductor devices 12. The hot air escapes the device through small ventilation holes (not illustrated) that perforate cover 19.

In the plasma display device of the present invention described above, heat generated by the PDP 2 and the driving circuit boards 4 is discharged to outside the display device through the thermoelectric semiconductor devices 12 mounted in or on the back cover, thereby enhancing the heat-discharge capability of the display device. Further, by mounting the thermoelectric semiconductor devices 12 within the back cover, the plasma display device may be designed having a slim profile and its internal structure is kept simple.

Although embodiments of the present invention have been described in detail hereinabove in connection with certain exemplary embodiments, it should be understood that the invention is not limited to the disclosed exemplary embodiments, but, on the contrary is intended to cover modifications, combinations of embodiments and/or equivalent arrangements included within the spirit and scope of the present invention, as defined in the appended claims.

What is claimed is:

1. A plasma display device, comprising:
    a plasma display panel comprising a front surface that displays images and a back surface opposite to the front surface;
    a chassis base attached to the back surface of the plasma display panel to support the plasma display panel, the chassis base comprising a plurality of driving circuit boards mounted on the chassis base;
    a front cabinet arranged adjacent to the front surface of the plasma display panel;
    a back cover arranged adjacent to a surface of the chassis base opposite the surface of the chassis base adjacent to the plasma display panel, the back cover being integrally assembled to the front cabinet with the chassis base and the plasma display panel arranged in between the back cover and the front cabinet, the back cover having an interior surface that faces the chassis base and an exterior surface that faces away from the chassis base; and
    a plurality of thermoelectric semiconductor devices arranged on one of the interior surface and the exterior surface of the back cover, each of said plurality of thermoelectric semiconductor devices comprising a heat absorbing surface that faces the chassis base and a heat emitting surface that faces an exterior side of the back cover, the plurality of thermoelectric semiconductor devices being adapted to discharge heat generated by the plasma display panel and the plurality of driving circuit boards to the exterior side of the back cover.

2. The plasma display device of claim 1, wherein each of the plurality of thermoelectric semiconductor devices are electrically connected to a power supply board via thermoelectric semiconductor drivers.

3. The plasma display device of claim 2, further comprising:
    a temperature sensor adapted to detect an internal temperature of the plasma display device and adapted to output corresponding signals; and
    a controller adapted to receive the corresponding temperature signals from the temperature sensor, the controller being programmed and configured to control an operation of the plurality of thermoelectric semiconductor devices based on the detected internal temperature of the plasma display device.

4. The plasma display device of claim 1, wherein the plurality of thermoelectric semiconductor devices are arranged on the interior surface of the back cover such that the heat emitting surfaces of the thermoelectric semiconductor devices contact the back cover.

5. The plasma display device of claim 1, wherein the plurality of thermoelectric semiconductor devices are fixed to the exterior surface of the back cover such that the heat absorbing surfaces of the thermoelectric semiconductor devices contact the back cover.

6. The plasma display device of claim 1, further comprising a plurality of thin metal plates, each thin metal plate being attached to respective heat absorbing surfaces of each of the plurality of thermoelectric semiconductor devices, each thin metal plate having a larger surface area than the corresponding thermoelectric semiconductor devices.

7. The plasma display device of claim 6, wherein the thin metal plates comprise a material selected from the group consisting of aluminum and copper.

8. The plasma display device of claim 6, further comprising a thermal conduction member arranged between each pair of the heat absorbing surfaces of the thermoelectric semiconductor devices and their corresponding thin metal plates.

9. The plasma display device of claim 1, further comprising a heat sink being arranged on corresponding heat absorbing surfaces of the thermoelectric semiconductor devices.

10. The plasma display device of claim 9, further comprising a thermal conduction member arranged between the heat sink and each corresponding heat absorbing surface of a corresponding thermoelectric semiconductor device.

11. A plasma display device, comprising:
    a plasma display panel comprising a front surface that displays images and a back surface opposite to the front surface;
    a chassis base attached to the back surface of the plasma display panel to support the plasma display panel, the chassis base comprising a plurality of driving circuit boards mounted on the chassis base;
    a front cabinet arranged adjacent to the front surface of the plasma display panel;
    a back cover arranged adjacent to a surface of the chassis base opposite the surface of the chassis base adjacent to the plasma display panel, the back cover being integrally assembled to the front cabinet with the chassis base and the plasma display panel arranged in between the back cover and the front cabinet;
    a plurality of thermoelectric semiconductor devices arranged on the back cover, each of said plurality of thermoelectric semiconductor devices comprising a heat absorbing surface that faces the chassis base and a heat emitting surface that faces an exterior side of the back cover, the plurality of thermoelectric semiconductor devices being adapted to discharge heat generated by the plasma display panel and the plurality of driving circuit boards to the exterior side of the back cover; and a heat sink arranged on each heat emitting surface of a corresponding thermoelectric semiconductor device.

12. A plasma display device, comprising:
a plasma display panel comprising a front surface that displays images and a back surface opposite to the front surface;
a chassis base attached to the back surface of the plasma display panel to support the plasma display panel, the chassis base comprising a plurality of driving circuit boards mounted on the chassis base;
a front cabinet arranged adjacent to the front surface of the plasma display panel;
a back cover arranged adjacent to a surface of the chassis base opposite the surface of the chassis base adjacent to the plasma display panel, the back cover being integrally assembled to the front cabinet with the chassis base and the plasma display panel arranged in between the back cover and the front cabinet;
a plurality of thermoelectric semiconductor devices arranged on the back cover, each of said plurality of thermoelectric semiconductor devices comprising a heat absorbing surface that faces the chassis base and a heat emitting surface that faces an exterior side of the back cover, the plurality of thermoelectric semiconductor devices being adapted to discharge heat generated by the plasma display panel and the plurality of driving circuit boards to the exterior side of the back cover; and
an insulating cover arranged over each heat emitting surface of corresponding thermoelectric semiconductor devices.

13. The plasma display device of claim 1, further comprising:
a temperature sensor adapted to detect an internal temperature of the plasma display device and outputting corresponding temperature signals; and
a controller arranged to receive the temperature signals from the temperature sensor, the controller being programmed and configured to control the thermoelectric semiconductor devices based on the received temperature signals.

14. A plasma display device, comprising:
a plasma display panel displaying images on a front surface, the plasma display panel having a back surface opposite to the front surface; and
a back cover that covers and faces the back surface of the plasma display panel, the back cover being perforated by a plurality of openings, each opening comprising a thermoelectric semiconductor device arranged therein and adapted to draw heat away from the plasma display panel and through the openings in the back cover to an exterior of the plasma display device, each thermoelectric semiconductor device comprising:
a p-type semiconductor material;
an n-type semiconductor material; and
metal strips, the p-type semiconductive material, the n-type semiconductor material and the metal strips each being electrically connected to each other inside an opening in said back cover.

15. The plasma display device of 14, further comprising a plurality of driving circuit boards arranged between said back cover and said back surface of said plasma display panel, said thermoelectric semiconductor devices also being adapted to draw heat away from the driving circuit boards and through the openings in the back cover to an exterior of the plasma display device.

16. The plasma display device of claim 15, further comprising a heat sink disposed between the back cover and the driving circuit boards.

17. The plasma display device of claim 16, the heat sink being in direct contact with circuit elements on said driving circuit boards.

18. The plasma display device of claim 16, said heat sink being separated by a predetermined distance from circuit elements on said driving circuit boards, said heat sink not being in contact with any circuit elements on said driving circuit boards.

19. The plasma display of claim 17, further comprising a thermal conduction member arranged between the heat sink and the back cover, the thermal conduction member being in contact with both said heat sink and the back cover and with the thermoelectric semiconductor elements in the openings in the back cover.

20. The plasma display of claim 19, the thermal conduction member being comprised of a material selected from the group consisting of silicon and a thin carbon sheet.

21. A plasma display device, comprising:
a plasma display panel comprising a front surface that displays images and a back surface opposite to the front surface;
a chassis base attached to the back surface of the plasma display panel and arranged to support the plasma display panel, the chassis base comprising a plurality of driving circuit boards mounted on the chassis base;
a front cabinet positioned adjacent to the front surface of the plasma display panel;
a back cover arranged on a side of the chassis base opposite the side of the chassis base facing the plasma display panel, the back cover being integrally assembled to the front cabinet with the chassis base and the plasma display panel arranged in between;
a plurality of thermoelectric semiconductor devices arranged between the back cover and the chassis base and adapted to draw heat away from the driving circuit boards and the plasma display panel to an outside of the plasma display panel through the back cover; and
a heat sink arranged between the plurality of thermoelectric semiconductor devices and the chassis base, the heat sink being in contact with heat dissipating circuit elements on the driving circuit boards on the chassis base, the heat sink also being in contact with the plurality of thermoelectric semiconductor devices.

22. The plasma display panel of claim 21, said plurality of thermoelectric semiconductor devices being in contact with the back cover.

23. The plasma display panel of claim 21, the plurality of thermoelectric semiconductor devices not being in contact with the back cover and being separated from the back cover by a predetermined distance.

24. The plasma display panel of claim 23, the back cover being perforated by a plurality of holes, said plurality of holes being adapted for ventilation and not for accommodation of thermoelectric semiconductor devices.

* * * * *